(12) United States Patent
Kato et al.

(10) Patent No.: US 6,652,781 B2
(45) Date of Patent: Nov. 25, 2003

(54) METHOD FOR MANUFACTURE OF OPTICAL ELEMENT

(75) Inventors: Hideo Kato, Utsunomiya (JP); Hiroshi Maehara, Yokohama (JP); Makoto Ogusu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 09/754,311

(22) Filed: Jan. 5, 2001

(65) Prior Publication Data

US 2001/0002074 A1 May 31, 2001

Related U.S. Application Data

(62) Division of application No. 09/325,562, filed on Jun. 4, 1999.

(30) Foreign Application Priority Data

Jun. 11, 1998 (JP) ............................................. 10-179638
Sep. 4, 1998 (JP) ............................................. 10-267430

(51) Int. Cl.$^7$ ................................................. B29D 11/00
(52) U.S. Cl. ......................... 264/1.9; 156/153; 264/442; 264/334; 427/133; 427/162
(58) Field of Search ........................... 264/1.1, 2.5, 1.7, 264/334, 1.9, 442, 1.32; 156/153; 427/133, 162

(56) References Cited

U.S. PATENT DOCUMENTS

| | | | | |
|---|---|---|---|---|
| 4,609,267 A | | 9/1986 | Deguchi et al. ............. | 351/163 |
| 4,810,318 A | * | 3/1989 | Haisma et al. .............. | 156/153 |
| 4,895,790 A | | 1/1990 | Swanson et al. ............ | 430/321 |
| 4,936,665 A | | 6/1990 | Whitney ..................... | 350/451 |
| 5,160,668 A | | 11/1992 | Imus .......................... | 264/1.7 |
| 5,580,407 A | * | 12/1996 | Haisma et al. .............. | 156/153 |
| 5,820,895 A | * | 10/1998 | Widman et al. ............ | 264/334 |

FOREIGN PATENT DOCUMENTS

| | | | |
|---|---|---|---|
| JP | 61-283509 | * | 12/1986 |
| JP | 5-297210 | | 11/1993 |
| JP | 7-191209 | | 7/1995 |
| JP | 8-90665 | | 4/1996 |

* cited by examiner

Primary Examiner—Mathieu D. Vargot
(74) Attorney, Agent, or Firm—Fitzpatrick, Cella, Harper & Scinto

(57) ABSTRACT

In a method for manufacture of an optical element, a thin film is formed on a surface, such as a grating surface, an aspherical surface or a spherical surface, formed on a mold. Then, a substrate is bonded to the thin film. Subsequently, the thin film and the substrate are separated from the mold.

24 Claims, 14 Drawing Sheets

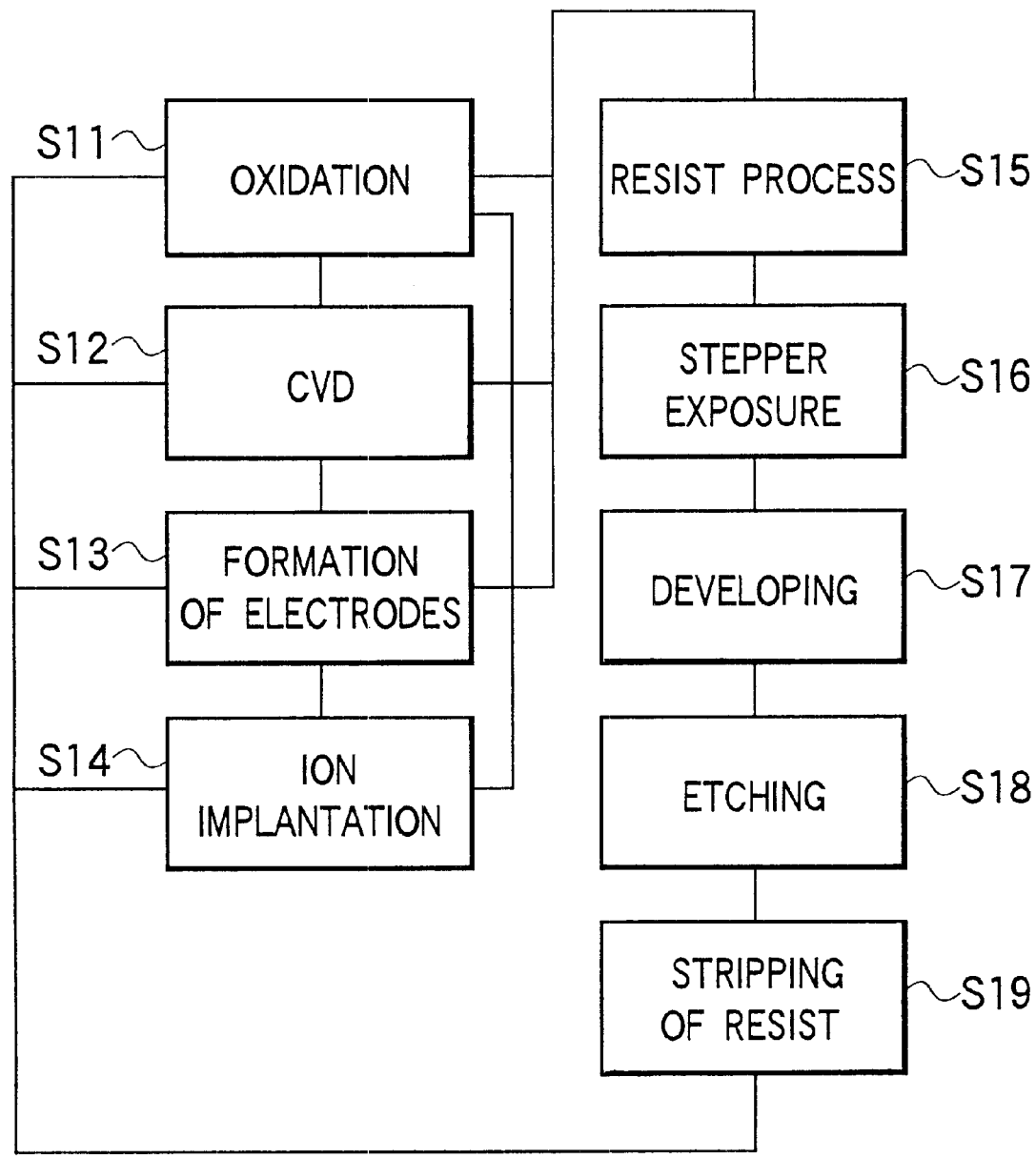

METHOD FOR MANUFACTURE OF OPTICAL ELEMENT

This application is a division of application Ser. No. 09/325,562, filed Jun. 4, 1999.

BACKGROUND OF THE INVENTION

1. Field of the Invention

The present invention relates to a method for manufacturing an optical element which is used for an exposure apparatus, a photo-taking apparatus, an illumination apparatus, etc. The optical element includes, for example, a diffractive optical element, a spherical lens, an aspherical lens, etc.

2. Description of Related Art

Diffraction gratings have heretofore been used as spectral elements for spectroscopes. Some of the diffraction gratings are in a saw-tooth-like sectional shape called a blazed type, and the diffraction efficiency of some of the diffraction gratings reaches 100%. Meanwhile, as optical elements which also utilize diffraction, binary optics (abbreviated as "BO") elements, which have diffraction gratings formed in a step-like sectional shape, have recently come to draw attention. A BO lens, which is one of the BO elements, is expected to give achromatic effect and aspherical effect and is, therefore, expected to greatly contribute to the development of novel optical systems using ultraviolet rays, etc.

In a case where the BO lens is to be used for a stepper (projection exposure apparatus), for example, the BO lens is required to meet specifications which much exceed the current machinable limit for the blazed-type diffraction grating. However, fine machining on a diffraction grating can be carried out with a certain degree of precision by a lithographic process employed in machining a semiconductor wafer. For example, a BO lens having eight steps aligned thereon can be manufactured by a photo-lithography by using quartz for the substrate of the BO lens, using an i-ray stepper (semiconductor exposure apparatus) for an exposure printing process, and using a parallel-plate-type reactive ion etching (RIE) apparatus for a dry etching process.

In manufacturing the BO lens in such a manner, if the BO lens is desired to be about 20 mm in diameter, for example, the BO lens can be manufactured by repeatedly performing an exposure process a total of three times by using three masks patternized with chromium, and performing a developing process and a dry-etching process respectively a total of three times. In actually manufacturing a large BO lens which measures 200 mm or thereabout in diameter for the lens used for the stepper, however, it is necessary to make divisional exposures which are almost one hundred in number, and at least fifteen chromium masks are required for the one hundred divisional exposures.

The conventional manufacturing method as described above thus necessitates many manufacturing processes. The large number of processes lowers productivity and increases the cost of manufacture. To solve this problem, it is conceivable to manufacture the BO lens by a molding method. However, in the case of a BO lens to be included in an optical system adapted for ultraviolet rays and particularly for far ultraviolet rays, the material usable for the BO lens must be selected from a limited range of high-melting-point materials such as quartz, fluorite, sapphire, etc. Hence, it is very difficult to find any metal material that is usable as a mold (die) and is capable of withstanding such a high temperature at which the high-melting-point material is to be melted for molding. Besides, in such a case, the precision of machining would be deteriorated by the thermal expansion of the mold material and the contraction of the material taking place when the material cools down. The problem of contraction taking place when the material cools down also takes place in a case where a BO lens or aspherical lens for visible rays is to be manufactured by molding with a glass or plastic material.

Meanwhile, machining for an aspherical surface of a lens or the like is impossible by a lapping process employed as one of methods for machining work on the spherical and level surfaces of a spherical lens, a prism, etc.

In machining an aspherical surface, it has been practiced to adopt, for example, a stripping machining process whereby the aspherical surface is machined with loose abrasive by pressing a finishing shape against the surface. It is a basic concept of the stripping machining process to obtain a desired shape by generating a working amount distribution. However, according to the stripping machining process, not only work efficiency is low, requiring much time and labor for measuring and repeating machining work on necessary parts, but also some skill in machining work is necessary.

Known aspherical surface processing methods include an adding machining process. The adding machining process is carried out to obtain an optical aspherical surface by vapor-depositing, on a polished glass surface, aluminum for a reflecting mirror, or ZnS for a light-transmissive element, and varying the thickness of the vapor-deposited film through a vapor deposition mask. It is also known to obtain an aspherical surface by controlling an attaching amount of metal plating.

A deforming-work molding process is also known as another aspherical surface processing means. According to the deforming-work molding process, with both a material and a mold being heated, an optical aspherical surface is obtained by deforming the material while pressing the material against the mold in the heated state. The force of deformation can be generated by its own weight of the material, or by applying pressure or by pulling the material under reduced pressure.

However, the stripping machining process is not suited for mass production as it has a low work efficiency and requires some skill for the work.

In the case of the adding machining process, the controllable limit of thickness of the vapor-deposited film is several $\mu$m. Therefore, both the plating method and the vapor deposition method are hardly suited for obtaining an aspherical surface at a high rate of precision. Besides, the plating method is usable only for forming a reflecting optical surface.

Further, the deforming-work molding process not only presents problems in respect of mold releasability, surface denaturation, etc., but also necessitates heating the material up to a temperature higher than a transition point of the material for the purpose of deforming the material as desired. Even in a case where a low melting-point glass material is employed, the glass material must be heated up to a temperature between 320° C. and 330° C. The usable wavelengths for a lens obtained by using a low melting-point glass or plastic material to which the deforming-work molding process is applicable are visible wavelengths. In order to obtain a lens which is usable for the wavelengths of ultraviolet rays, particularly, far ultraviolet rays, a high melting-point material such as quartz, fluorite, sapphire or the like must be used.

Therefore, the material of a mold to be used must be selected by considering various properties resulting from a thermal reaction, including the fusibility of a metal mold, mold releasability, oxidation resisting property, the characteristics of denaturation and deterioration of the surface, and the thermal expansion, heat conduction, high temperature strength, grain boundaries, porosity, etc., required for retaining geometric precision and surface roughness. In addition to these matters, the basic conditions required for the preparation of a mold including the workability, machinability, thin-film adhesiveness, cost, etc., of the mold must be taken into consideration. The range of selectable materials is, therefore, extremely narrow.

BRIEF SUMMARY OF THE INVENTION

It is an object of the invention to provide an improved method for manufacture of an optical element, by which the above-stated problems of the prior art can be solved.

To attain the above object, in accordance with an aspect of the invention, there is provided a method for manufacture of an optical element, the method comprising a step of forming a thin film on a surface, such as a grating surface, an aspherical surface or a spherical surface, formed on a mold, a step of bonding a substrate to the thin film, and a step of separating the thin film and the substrate from the mold.

Further, in accordance with another aspect of the invention, there is provided a method for manufacture of an optical element, the method comprising a step of forming a thin film on a surface, such as a grating surface, an aspherical surface or a spherical surface, formed on a mold, a step of polishing a surface of the thin film, a step of bonding a substrate to the polished surface of the thin film, and a step of separating the thin film and the substrate from the mold.

The above and other objects and features of the invention will become apparent from the following detailed description of preferred embodiments thereof taken in connection with the accompanying drawings.

BRIEF DESCRIPTION OF THE SEVERAL VIEWS OF THE DRAWING

FIG. 27 is a flow chart showing a wafer process.

DETAILED DESCRIPTION OF THE INVENTION

Hereinafter, preferred embodiments of the invention will be described in detail with reference to the drawings.

Figure 1:
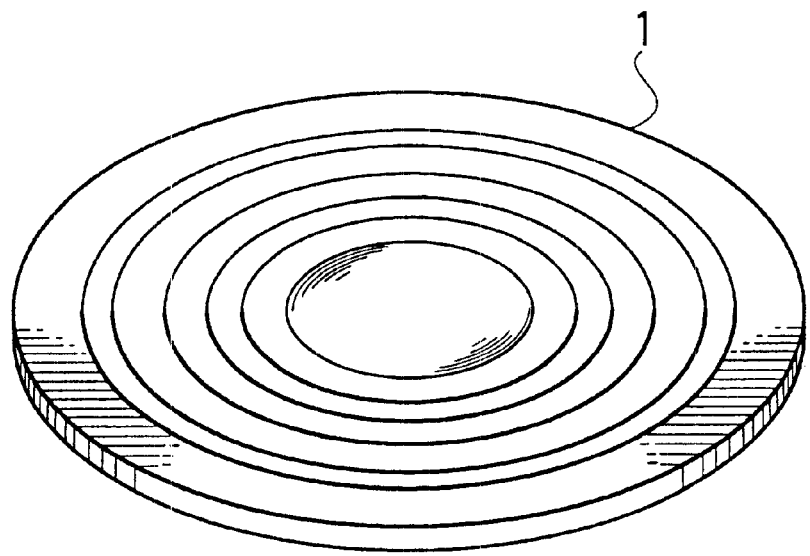
FIG. 1 is a perspective view showing a BO lens which is a diffractive optical element (DOE).
Figure 2:
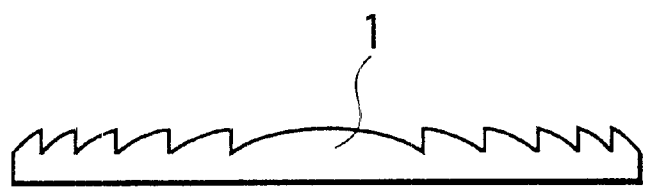
FIG. 2 is a sectional view of the BO lens (DOE).
Figure 3:
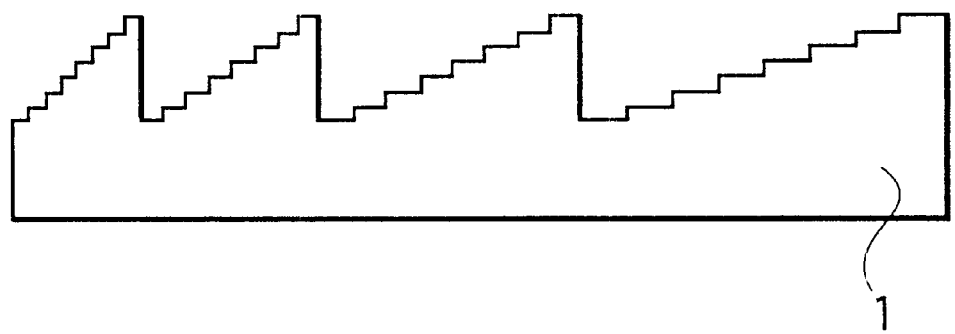
FIG. 3 is an enlarged sectional view of ring zones of the BO lens.

FIG. 1 is a perspective view showing a BO (binary optics) lens 1 which is a diffractive optical element. FIG. 2 is a sectional view of the BO lens 1. FIG. 3 is an enlarged sectional view showing ring zones of the BO lens 1. The BO lens 1 has a circular shape of 20 mm in diameter, in which the design wavelength is 248 nm (KrF laser beam), the number of ring zones which are fundamental elements of the BO lens 1 is about 18,000, and each of the ring zones is composed of eight steps. In the outermost ring zone of the BO lens 1, each of the eight steps measures 0.35 $\mu$m in width (length in the direction of diameter) and 0.062 $\mu$m in height (length in the direction of an optical axis), and the outermost ring zone itself measures 2.8 $\mu$m in width and 0.434 $\mu$m in height.

Figure 4:
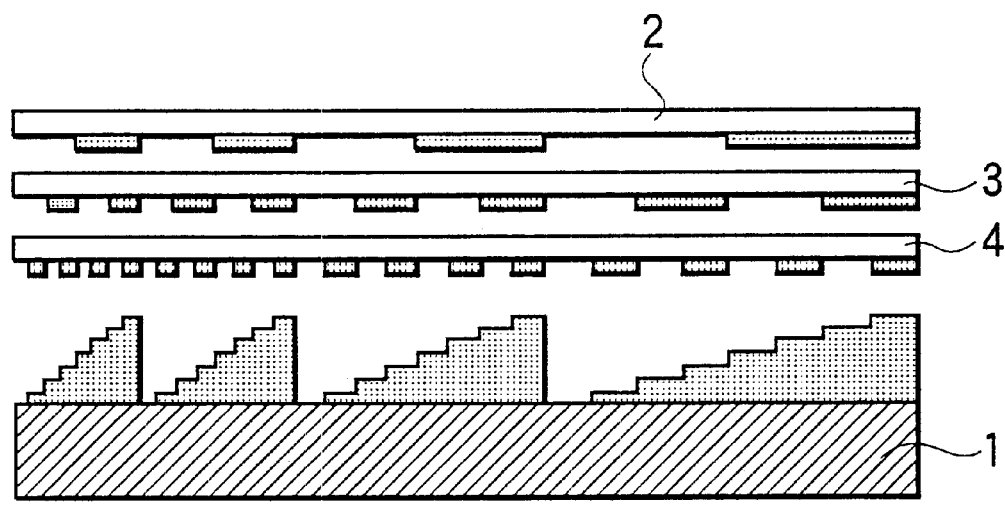
FIG. 4 is a sectional view showing the BO lens and three masks.

FIG. 4 shows in a sectional view the BO lens which is to be used for making a mold (die) and masks which are to be used for making the BO lens by lithography. A quartz substrate measuring 220 mm in diameter and 6 mm in thickness is used. Three masks 2, 3 and 4 are placed one after another above the quartz substrate. Then, an exposure is made on the quartz substrate through the masks 2, 3 and 4 via a projection optical system. For the exposure, an i-ray stepper for the exposure wavelength of 365 nm is used to expose a photo resist on the quartz substrate to the patterns of the masks 2, 3 and 4 in a reduced size. After the exposure, the photo resist is developed to form a resist pattern. Then, by using the resist pattern as a mask, the quartz substrate is subjected to an etching process by a dry etching (RIE) method. This process is repeated three times to make a BO lens 1 having ring zones each of which is composed of eight steps.

The exposure and etching processes are performed on the quartz substrate by dividing its whole area which measures 220 mm in diameter. More specifically, the exposure is made by taking a total of 76×3=228 shots using five sets of the three masks 2, 3 and 4, i.e., with a total of 15 masks, and the dry etching process is performed three times.

Figure 5:
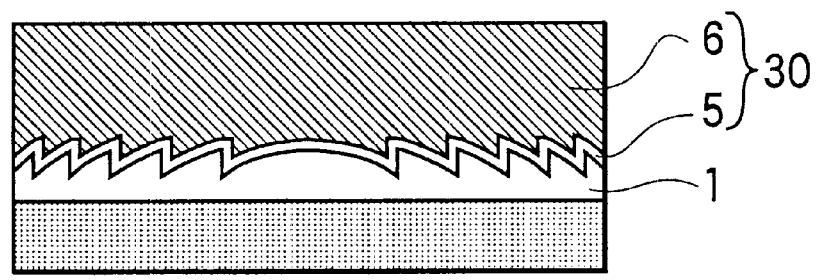
FIG. 5 is a sectional view for explaining the method of making a BO molding mold.

FIG. 5 is a sectional view for explaining the method of making a molding mold. As shown in FIG. 5, the BO lens 1 is used as an original plate. A tungsten-molybdenum alloy film 5 having a low stress is formed to a thickness of 10 μm on the diffraction grating surface of the BO lens 1 by a sputtering vapor deposition process. Following this film forming process, an electroformed nickel substrate 6 is formed by nickel plating with the alloy film 5 used as electrodes. After that, the BO lens 1 is separated from the alloy film 5, so that a BO molding mold (die) 30 measuring 10 mm in thickness is formed. Since the BO molding mold 30 is composed of the alloy film 5 of low stress and the nickel substrate 6 of low stress, it has little ageing deterioration and thus excels in dimensional stability.

Figure 6:
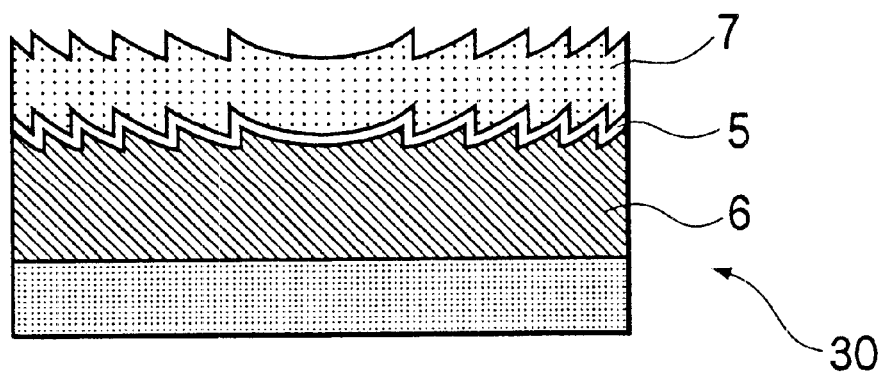
FIG. 6 is a sectional view for explaining the processes of manufacturing a molded BO lens according to a first embodiment of the invention.
Figure 7:
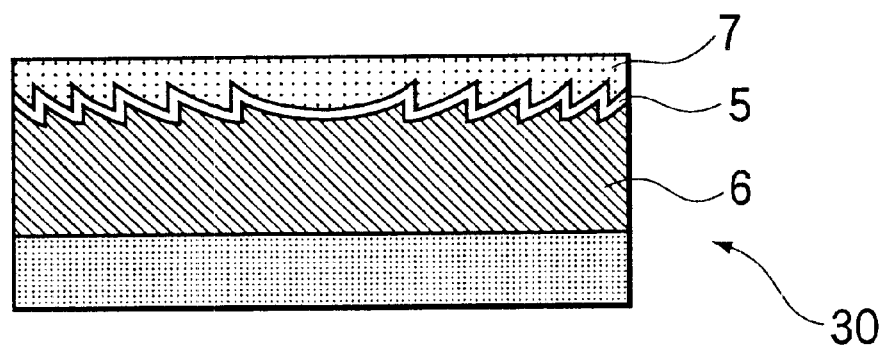
FIG. 7 is a sectional view for explaining the processes of manufacturing the molded BO lens according to the first embodiment.
Figure 8:
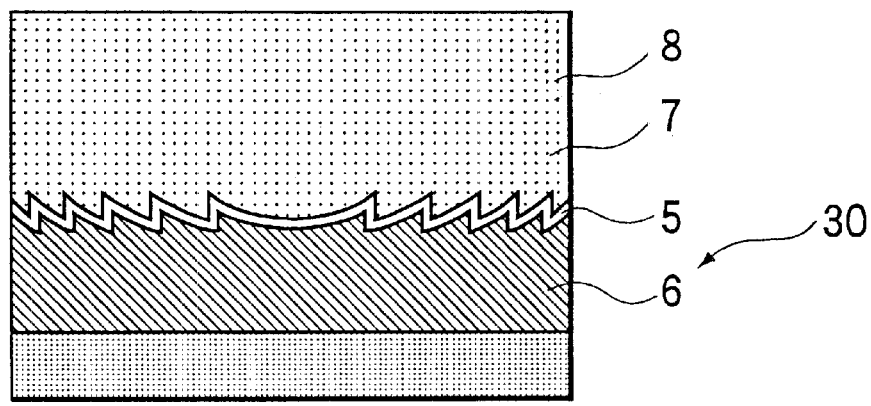
FIG. 8 is a sectional view for explaining the processes of manufacturing the molded BO lens according to the first embodiment.
Figure 9:
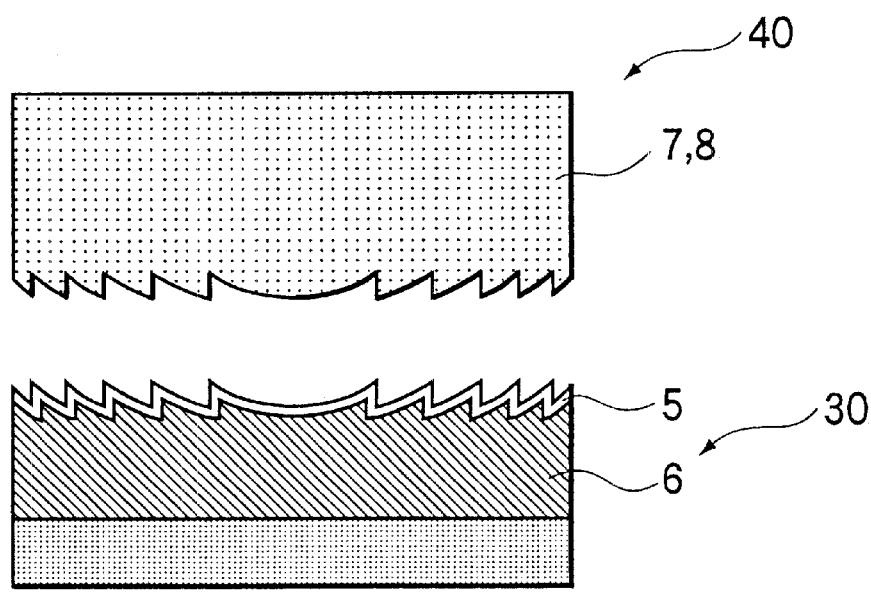
FIG. 9 is a sectional view for explaining the processes of manufacturing the molded BO lens according to the first embodiment.

FIG. 6 is a sectional view for explaining the process of manufacturing the molded BO lens according to a first embodiment of the invention. Referring to FIG. 6, the mold 30 is made as mentioned above with the tungsten-molybdenum alloy film 5 and the electroformed nickel substrate 6 by plating. An $SiO_2$ film 7 is applied to the mold 30 to a thickness of 5 μm by vapor deposition using a known sputtering vapor deposition apparatus (not shown) which is popularly employed as film forming means. Since the $SiO_2$ film 7 has some unevenness on its surface, the surface of the $SiO_2$ film 7 is polished, by setting the $SiO_2$ film 7 together with the mold 30 on a polishing machine, to a surface precision rate of about λ/10, as shown in FIG. 7. Following the polishing process, as shown in FIG. 8, a quartz substrate 8 which has the surface precision rate of λ/10 and measures 220 mm in diameter and 20 mm in thickness is bonded to the $SiO_2$ film 7 by a direct bonding process. In the last place, as shown in FIG. 9, the $SiO_2$ film 7 and the quartz substrate 8 which are bonded to each other are separated from the mold 30 either by energizing the mold 30 to heat them or by dipping them together with the mold 30 in an aqueous solution to which a surface active agent is added and by causing a ultrasonic wave to act in the aqueous solution. Accordingly, a molded BO lens 40 measuring 220 mm in diameter and 20 mm in thickness is manufactured through these processes.

It is also possible to manufacture a molded BO lens of high performance by a low-pressure CVD (chemical vapor deposition) method, instead of the sputtering vapor deposition method, through processes similar to the above-stated processes. Further, the $SiO_2$ film 7 and the quartz substrate 8 may be bonded together by using an ultraviolet-ray-setting type adhesive. In that instance, the adhesive is caused to harden by applying xenon lamp illumination through the quartz substrate 8 which measures 20 mm in thickness. An adequately molded BO lens then can be obtained by causing an ultrasonic wave to act within the aqueous solution to separate the BO lens from the mold.

A molded BO lens of high performance can be also manufactured in the following manner. In this case, $CaF_2$ is used in place of $SiO_2$ and a crystalline fluorite material is used for the substrate. A high-density vapor deposition film of $CaF_2$ is formed on the mold 30 by using an ion beam sputtering method. Then, polishing, bonding and separating processes are carried out in the same manner as the above-stated manner. It is also possible to manufacture an adequate molded BO lens by using $Al_2O_3$ (alumina) in place of $SiO_2$ and using a crystalline quartz material for the substrate, through processes which are similar to the processes described above.

In another adoptable method for manufacturing an adequate molded BO lens, an $SiO_2$ film is formed on the mold 30 by an alkyl-silicate-applying dipping process and a hydrolyzing process with heating at 350° C. After that, the molded BO lens is manufactured by carrying out processes which are similar to the processes described above. The dipping and hydrolyzing processes may be changed to use alkyl aluminate, alkyl titanate or the like in place of alkyl silicate.

Figure 10:
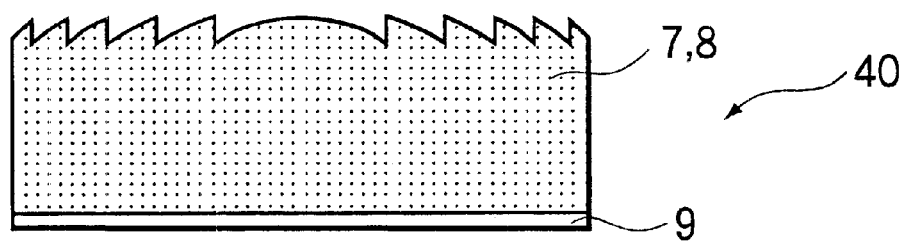
FIG. 10 is a sectional view showing the molded BO lens having an antireflection film applied thereto in the first embodiment.

FIG. 10 is a sectional view showing a molded BO lens to which an antireflection film is applied. In the case of FIG. 10, by using an RF sputtering method, laminated films of $MgF_2$ and $Al_2O_3$ which measure respectively 43 nm and 36 nm in thickness are applied to the reverse side of the molded BO lens as an antireflection film 9. The results of measurement made with a KrF laser beam indicated that the light utilizing efficiency of the molded BO lens obtained through this antireflection treatment was higher by 40%, on the average, than that of the molded BO lens obtained without the antireflection film 9.

The molded BO lens 40 which measures 220 mm in diameter and has the antireflection film 9 in the manner described above is incorporated into an illumination optical system and/or a projection optical system. The optical system is then mounted on a stepper for a KrF laser. The use of the stepper having such an optical system permits manufacture of a high-performance semiconductor chip by making a demagnification (reducing) exposure on a silicon substrate and carrying out a sequence of semiconductor manufacturing processes.

Figure 11:
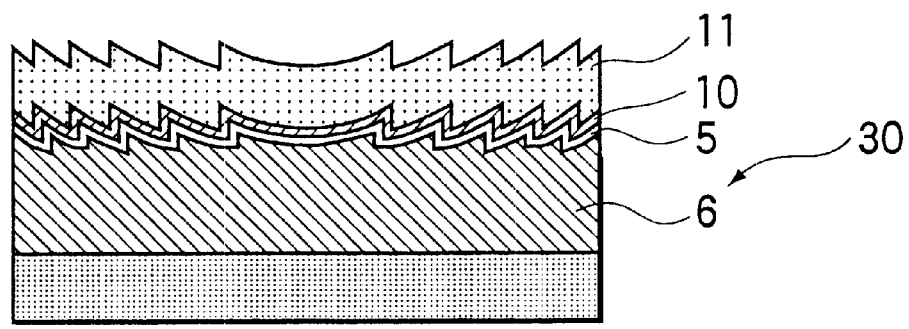
FIG. 11 is a sectional view for explaining the processes of manufacturing a molded BO lens according to a second embodiment of the invention.

FIGS. 11 to 14 are sectional views for explaining the processes for manufacturing a BO lens by molding according to a second embodiment of the invention. The second embodiment is characterized in that an antireflection film is formed directly on the mold 30. As shown in FIG. 11, on the mold 30 which is composed of the tungsten-molybdenum alloy film 5 and the electroformed nickel substrate 6, an antireflection multilayer film 10 is formed by vapor deposition to a thickness of about 0.18 μm by alternately applying $MgF_2$ and $SiO_2$ to the mold 30 respectively to a thickness of 62 nm using a multi-sputtering vapor deposition apparatus. To the multi-layer film 10, an $SiO_2$ film 11 is further applied by vapor deposition to a thickness of about 5 μm in a laminated state.

Figure 12:
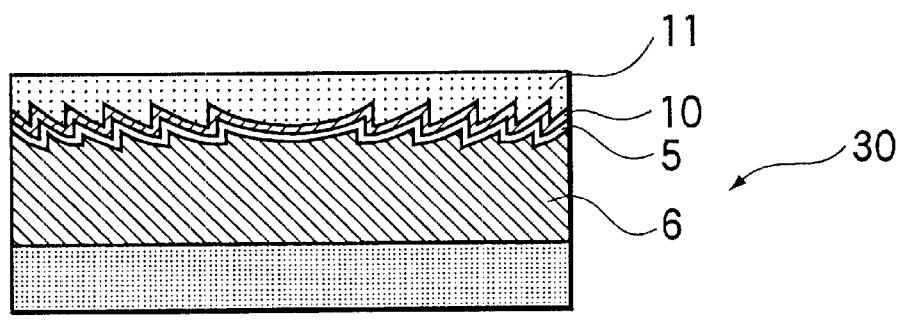
FIG. 12 is a sectional view for explaining the processes of manufacturing the molded BO lens according to the second embodiment.
Figure 13:
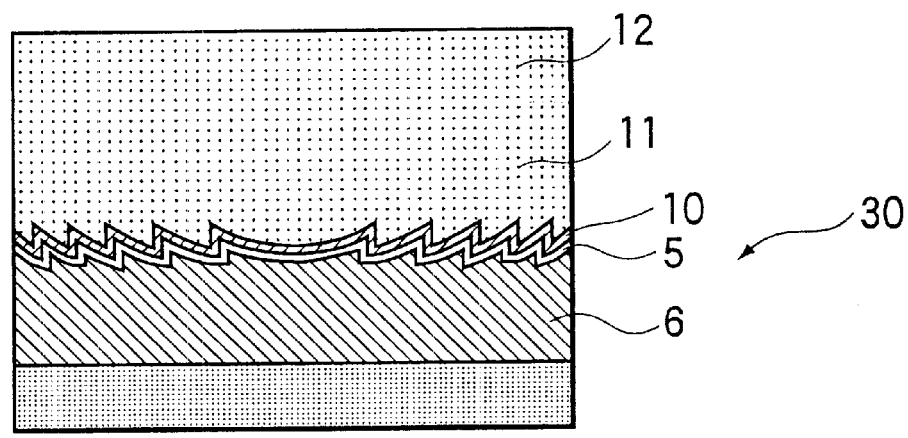
FIG. 13 is a sectional view for explaining the processes of manufacturing the molded BO lens according to the second embodiment.
Figure 14:
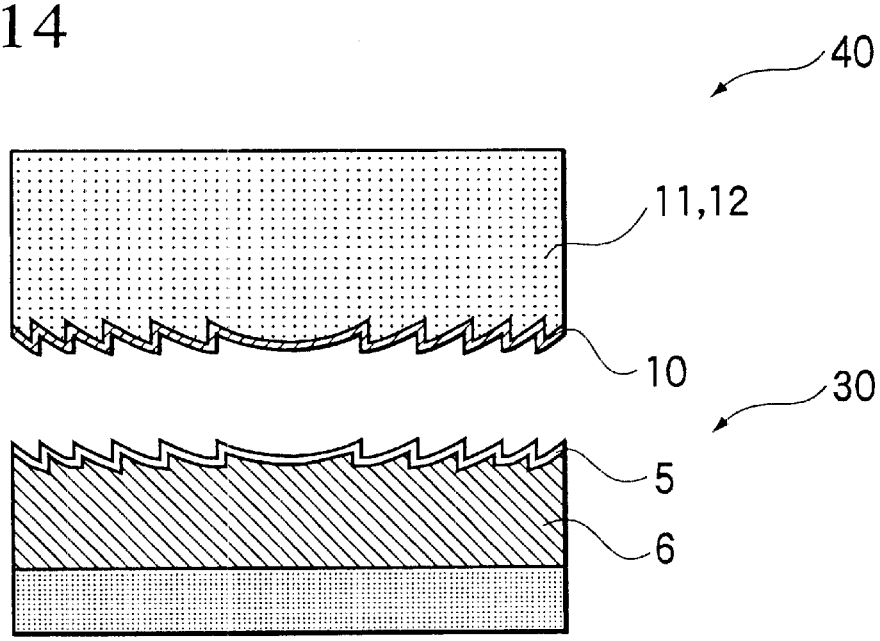
FIG. 14 is a sectional view for explaining the processes of manufacturing the molded BO lens according to the second embodiment.

The vapor deposition film 11 has a somewhat uneven surface. To remove the unevenness, the vapor deposition film 11 is set to a polishing machine together with the mold 30 and is subjected to a polishing process to obtain a surface precision rate of about λ/10, as shown in FIG. 12. After the polishing process, a quartz substrate 12 which is polished to a surface precision rate of about λ/10 and measures 220 mm in diameter and 20 mm in thickness is bonded to the vapor deposition film 11 by a direct bonding process, as shown in FIG. 13. Then, as shown in FIG. 14, the antireflection multilayer film 10, the $SiO_2$ film 11 and the quartz substrate 12 are separated from the mold 30 in the same manner as in the case of the first embodiment. Through these processes, a molded BO lens 40 which has the antireflection multilayer film 10 on its surface and measures 220 mm in diameter and 20 mm in thickness is manufactured.

Figure 15:
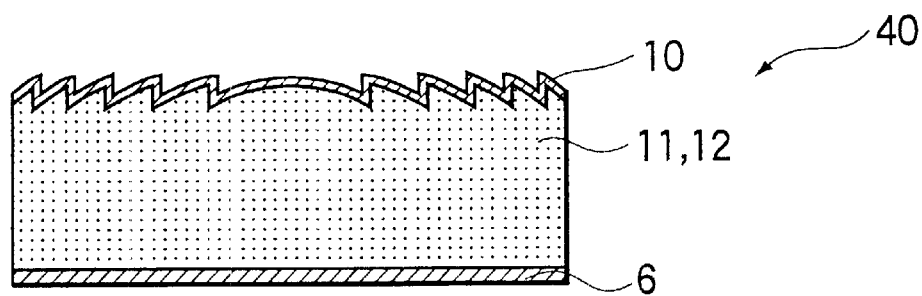
FIG. 15 is a sectional view showing the molded BO lens having antireflection films applied respectively to both sides thereof in the second embodiment.

It is also possible to manufacture a BO lens of high performance by first forming an $AlF_3$ film of a thickness of 43 nm on the mold 30 by a sputtering vapor deposition process, further forming an $SiO_2$ film by a low-pressure CVD process to a thickness of about 5 $\mu$m and then carrying out the same processes as described above. Further, as shown in FIG. 15, a four-layer laminated antireflection film 13 which is formed by alternately applying $AlF_3$ and $Al_2O_3$ films to thicknesses of 43 nm and 36 nm, respectively, may be formed on the reverse side of the molded BO lens. With the molded BO lens 40 thus provided with the antireflection films 10 and 13 both on its front and reverse sides, the molded BO lens 40 has a high rate of light utilizing efficiency.

In a case where a reflection-type BO lens (i.e., a mirror) designed for used with the wavelength of 248 nm (KrF laser light) is manufactured by using a molding method according to a third embodiment of the invention, each step of the reflection-type BO lens measures 0.0155 $\mu$m in height and eight steps of the reflection-type BO lens measure 0.1085 $\mu$m in height.

A carbon fluoride film is formed as a release agent on the mold for the reflection-type BO lens to have a thickness of 20 nm by the sputtering vapor deposition process. Following the release agent film, an aluminum film is likewise formed to have a thickness of 500 nm. The aluminum film thus formed on the mold is polished by a polishing machine to have a flat surface. The aluminum film thus polished is bonded to a silicon carbide substrate with an adhesive of the epoxy system. After that, the reflection-type BO lens is separated from the mold. Thus, the reflection-type BO lens is manufactured.

A reflection-type BO lens can be manufactured also by using silver in place of aluminum in the same manner.

Figure 16:
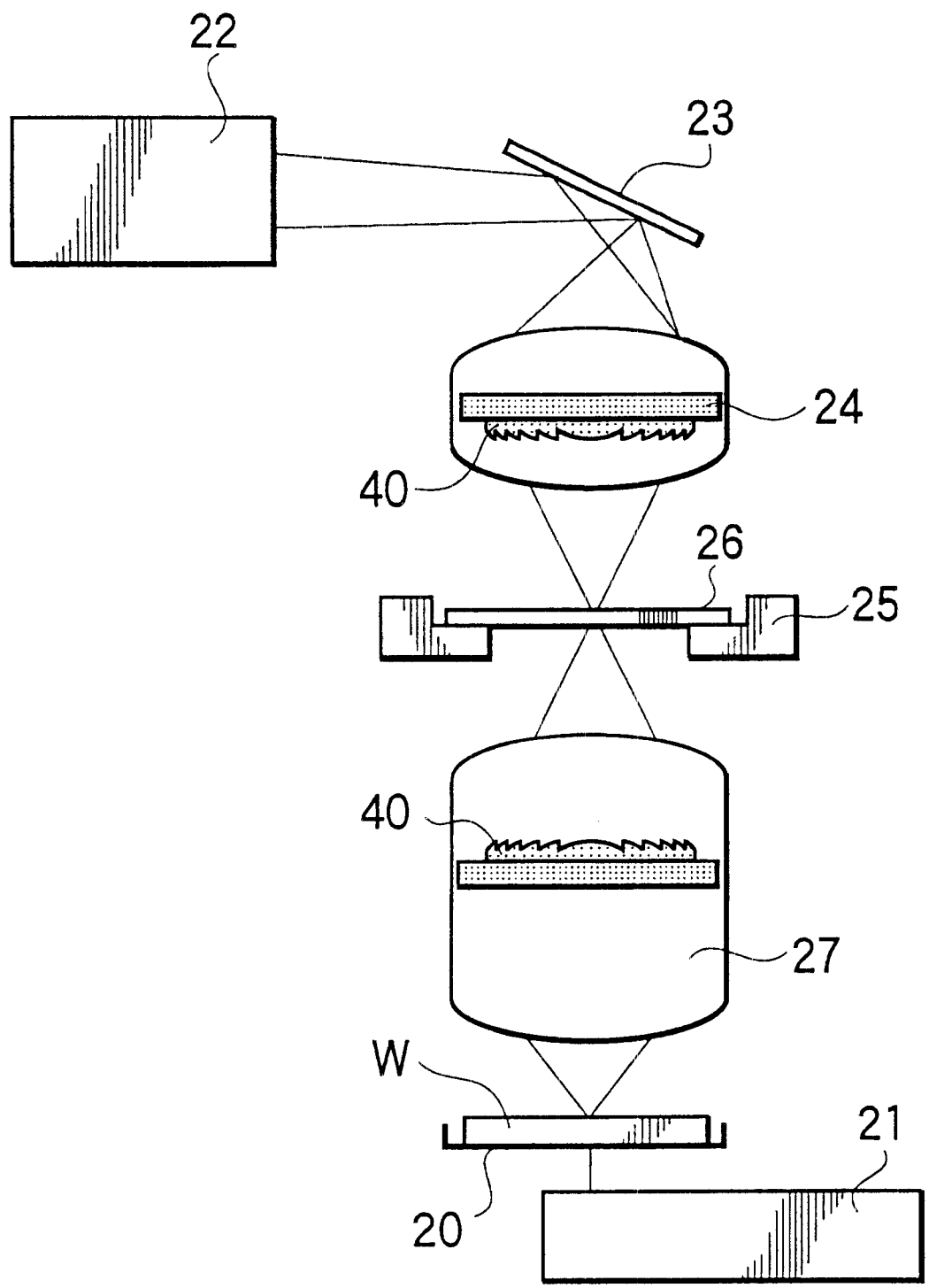
FIG. 16 shows the arrangement of a projection exposure apparatus into which a BO lens is incorporated.

FIG. 16 shows the arrangement of a demagnification projection exposure apparatus (stepper) for manufacturing semiconductor devices. A KrF excimer laser is used as an illumination light source. The BO lens 40 according to each of the embodiments described above is mounted in an illumination optical system and a projection optical system.

Referring to FIG. 16, a placing table 20 is fixed to the upper side of a stage 21 to place thereon a silicon wafer W having a resist film formed thereon. An excimer laser beam source 22, a reflecting mirror 23, an illumination optical system 24, a reticle 26 which is held by a support member 25, and a projection optical system 27 are arranged one after another above the placing table 20.

A KrF laser beam of wavelength 248 nm emitted from the excimer laser beam source 22 is led to the illumination optical system 24 after being deflected by the reflecting mirror 23. The illumination optical system 24 then causes the laser beam to become a light flux having a uniform sectional light intensity distribution. The light flux then illuminates the reticle 26 to form pattern light. The formed pattern light is reduced to ¼ in size by the projection optical system 27 and is projected from the projection optical system 27 onto the resist film of the silicon wafer W.

A process of exposure by the pattern light projection is serially performed including a positioning action through the stage 21 and a step/repeat exposure action. Incidentally, the arrangement for using the reflection-type BO lens for the reflecting mirror 23 effectively serves to lessen a load imposed on the illumination optical system 24.

According to the above-described method for manufacture of a diffractive optical element, a thin film composed of one or a plurality of layers is formed on the grating surface of a mold. After the surface of the thin film is polished, a substrate is bonded to the thin film. Then, the thin film and the substrate which are bonded to each other are separated from the mold to obtain the diffractive optical element. Accordingly, an optical element can be efficiently manufactured to be applicable not only to the wavelength region of visible rays but also to wavelength regions of ultraviolet and near ultraviolet rays.

Figure 17:
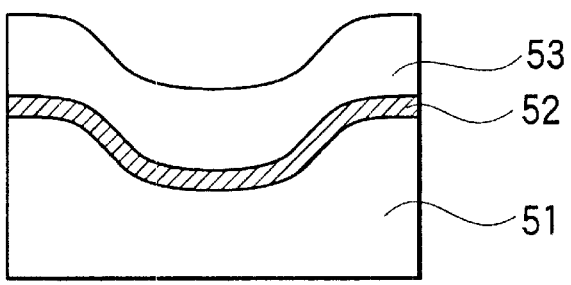
FIG. 17 is a sectional view for explaining a manufacturing process according to a fourth embodiment of the invention.

FIG. 17 is a sectional view for explaining a manufacturing process according to a fourth embodiment of the invention. In the case of the fourth embodiment, a sintered hard alloy is used as a base metal, and a mold 51 for an aspherical lens is machined by means of an NC machine tool. Then, a tungsten-molybdenum alloy film 52 is formed on the surface of the mold 51 to a thickness of about 10 $\mu$m. The mold 51 is thus made for an aspherical lens.

Figure 18:
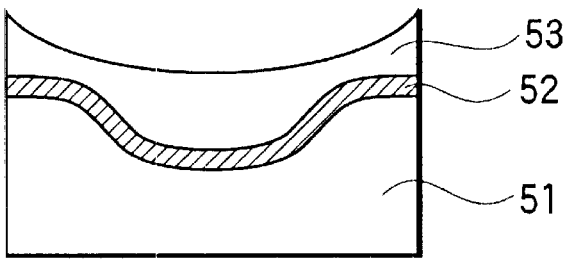
FIG. 18 is a sectional view for explaining the manufacturing process according to the fourth embodiment.
Figure 19:
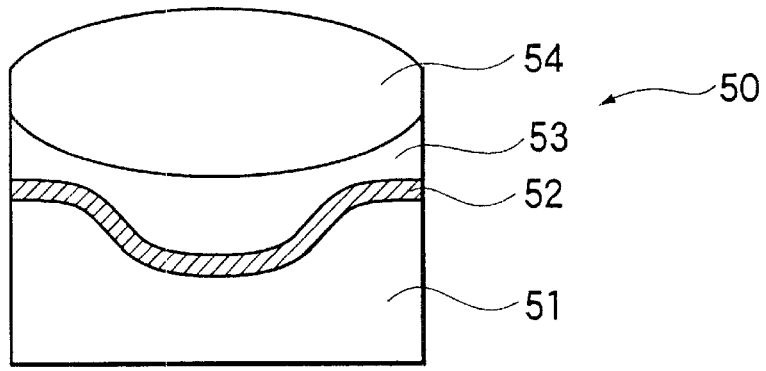
FIG. 19 a sectional view for explaining the manufacturing process according to the fourth embodiment.

On the alloy film 52, an $SiO_2$ vapor deposition film 53 is formed to a thickness of about 5 $\mu$m by using a sputtering vapor deposition apparatus. Since the surface of the vapor deposition film 53 is somewhat uneven, the surface of the vapor deposition film 53 is subjected to polishing by a polishing machine together with the mold 51 into a spherical surface of a surface precision rate of about $\lambda/10$, as shown in FIG. 18. After the polishing process, a spherical lens 54 which is polished to have about the same surface precision rate is bonded to the vapor deposition film 53 by a direct bonding process, as shown in FIG. 19.

Figure 20:
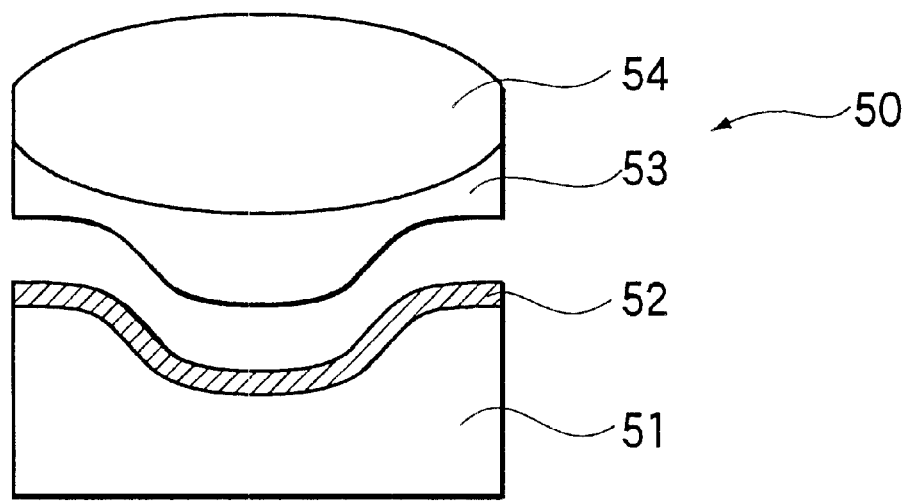
FIG. 20 a sectional view for explaining the manufacturing process according to the fourth embodiment.

As shown in FIG. 20, the $SiO_2$ vapor deposition film 53 and the spherical lens 54 are separated from the mold 51 which is coated with the alloy film 52, so that an aspherical lens 50 is obtained. This separating process can be easily carried out either by energizing the mold 51 for heating or by causing an ultrasonic wave to act in an aqueous solution to which a surface active agent is added. The molded-type aspherical lens 50 thus can be manufactured through these processes at a relatively low temperature.

In the fourth embodiment, a sintered hard alloy is used as a base metal for the mold 51. However, since temperature is raised by the processes only up to 100° C. or thereabout, the hard alloy may be replaced with some other metal that has a better workability.

Figure 21:
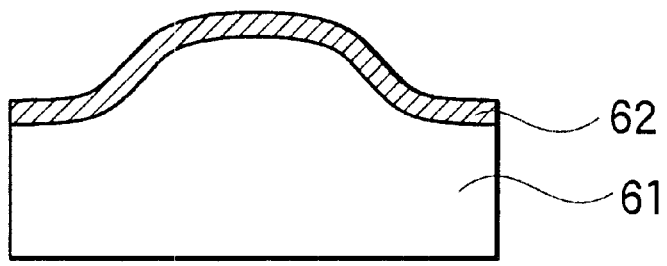
FIG. 21 is a sectional view for explaining a manufacturing process according to a fifth embodiment of the invention.
Figure 22:
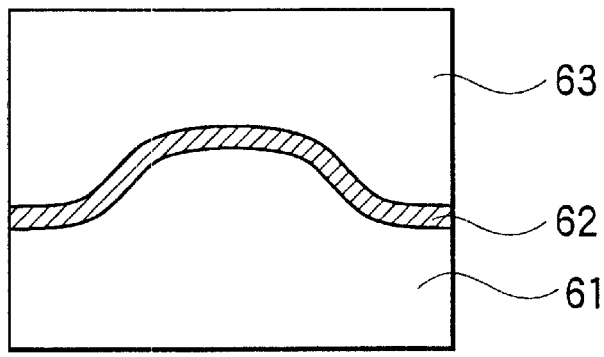
FIG. 22 is a sectional view for explaining the manufacturing process according to the fifth embodiment.
Figure 23:
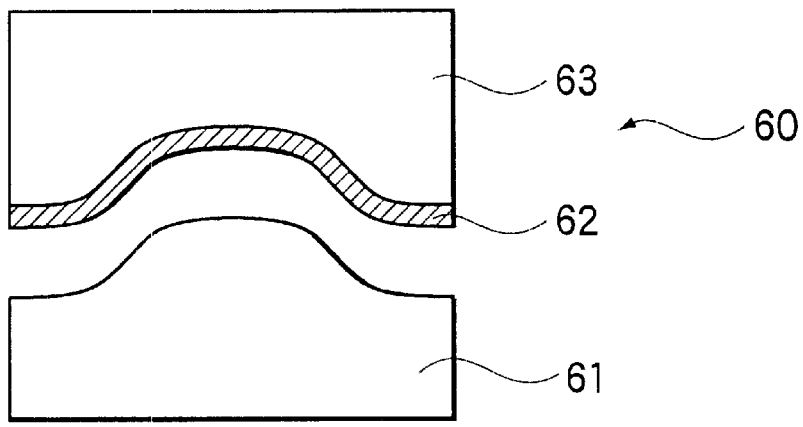
FIG. 23 is a sectional view for explaining the manufacturing process according to the fifth embodiment.

FIG. 21 is a sectional view for explaining a process of making a mold according to a fifth embodiment of the invention. In the case of the fifth embodiment, a master aspherical lens 61 is first formed by a known stripping machining process. Referring to FIG. 21, a tungsten-molybdenum alloy film 62 is formed on the surface of the master aspherical lens 61 to a thickness of 10 $\mu$m or thereabout by a sputtering vapor deposition process. Further, a nickel layer 63 is formed on the alloy film 62 by plating, i.e., by an electroforming process, with the alloy film 62 used as electrodes, as shown in FIG. 22. After that, the master aspherical lens 61 and the alloy film 62 are separated from each other, as shown in FIG. 23, to obtain a mold 60 measuring 10 mm in thickness for molding an aspherical lens. The thus-obtained mold 60 is composed of tungsten-molybdenum alloy and nickel of low stress and, therefore, little deteriorates due to ageing.

Figure 24:
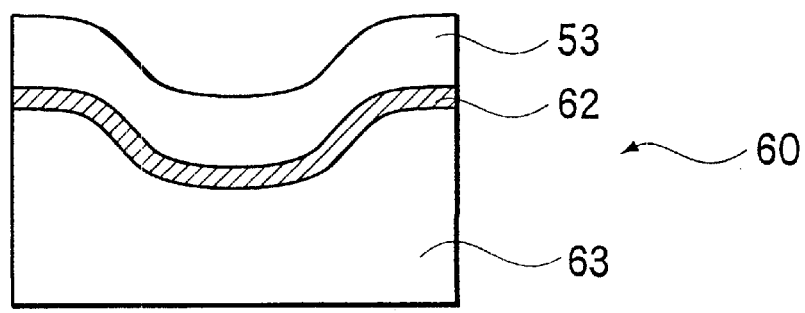
FIG. 24 is a sectional view for explaining the manufacturing process according to the fifth embodiment.

Then, by using a sputtering vapor deposition apparatus, as in the case of the fourth embodiment, an $SiO_2$ vapor deposition film 53 measuring 5 $\mu$m in thickness is applied by vapor deposition, as shown in FIG. 24, to the mold 60 which is made in the above-stated manner. After these processes, a molded-type aspherical lens 50 into which an antireflection film is incorporated can be manufactured by carrying out processes in the same manner as in the fourth embodiment shown in FIGS. 18 to 20.

The $SiO_2$ vapor deposition film 53 in the fourth and fifth embodiments can be formed by a low-pressure CVD (chemical vapor deposition) process, an alkyl-silicate-dipping coating process and a hydrolyzing process with heating at 350° C. Further, it is also possible to form an $Al_2O_3$ film or a $TiO_2$ film by carrying out a process of coating with alkyl aluminate or alkyl titanate, instead of alkyl silicate, and the hydrolyzing process.

Further, a $CaF_2$ film may be used in place of the $SiO_2$ vapor deposition film 53. A fluorite crystal material may be used as a substrate in place of the spherical lens 54. It is possible to manufacture an aspherical lens of high performance by forming a high-density $CaF_2$ film on the mold 51 through an ion beam sputtering process and, after that, by carrying out the same processes as those of the fourth embodiment. Further, an $Al_2O_3$ film may be formed in place of the $SiO_2$ vapor deposition film 53, and a quartz crystal material may be used as a substrate in place of the spherical lens 54.

The $SiO_2$ vapor deposition film 53, the $Al_2O_3$ film or the $TiO_2$ film may be replaced with a lamination which is obtained by alternately forming $MgF_2$ and $SiO_2$ layers respectively measuring 62 nm in thickness up to a total thickness of about 186 mm by using a multi-sputtering vapor deposition apparatus, and by further laying thereon an $SiO_2$ film to a thickness of about 5 $\mu$m. After that, a molded-type aspherical lens which has an antireflection film incorporated therein can be adequately manufactured by carrying out further processes in the same manner as the manufacturing processes of the fourth embodiment.

Further, the spherical lens 54 in the fourth embodiment which is polished to have a surface roughness of about $\lambda/10$ and the molded spherical lens which is polished by a polishing machine together with the mold 51 to have about the same surface roughness can be bonded together by an adhesive of the ultraviolet-ray setting (hardening) type. In this instance, the adhesive is hardened by illuminating it with a xenon lamp through a lens and by causing an ultrasonic wave to act within an aqueous solution to separate the mold 51 from the aspherical lens 50 which has the $SiO_2$ vapor deposition film 53 applied thereto by vapor deposition. After the separation from the mold, the adhesive is completely hardened by again illuminating it with ultraviolet rays for about one hour.

The method described above in each of the embodiments of the invention is applicable also to a case where a molded spherical lens is to be manufactured.

With the molded-type aspherical lens 50 having an antireflection film incorporated therein manufactured through the processes described above, an optical system which is formed to include the aspherical lens 50 is mounted on a stepper for a KrF laser. A semiconductor device of high performance can be manufactured by using the stepper through a reduction (demagnification) exposure on the silicon substrate and a sequence of semiconductor manufacturing processes.

Figure 25:
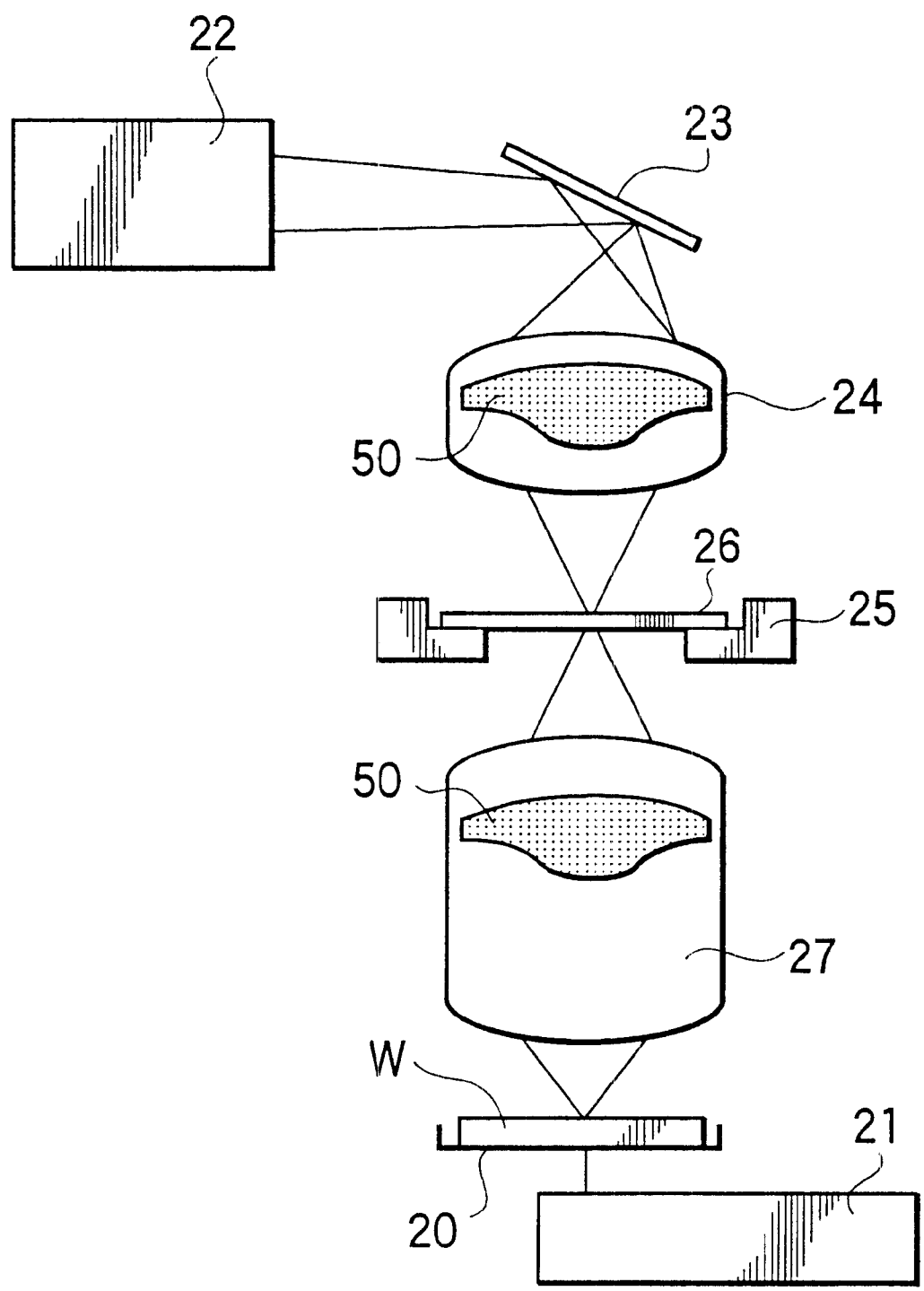
FIG. 25 shows the arrangement of a projection exposure apparatus in which the method for manufacture of an optical element is employed.

FIG. 25 shows the arrangement of a demagnification projection exposure apparatus (stepper) adapted for manufacture of semiconductors. Referring to FIG. 25, a KrF excimer later is used as an illumination light source. The aspherical lenses 50 manufactured in the fourth or fifth embodiment of the invention are mounted in an illumination optical system and a projection optical system.

A placing table 20 arranged to place thereon a silicon wafer W having a resist film is fixed to the upper side of a stage 21. As shown in FIG. 25, an excimer laser beam source 22, a reflecting mirror 23, an illumination optical system 24, a reticle 26 which is held by a support member 25, and a projection optical system 27 are arranged one after another above the placing table 20.

A KrF laser beam of wavelength 248 nm emitted from the excimer laser beam source 22 is led to the illumination optical system 24 after being deflected by the reflecting mirror 23. The illumination optical system 24 then causes the laser beam to become a light flux having a uniform sectional light intensity distribution. The light flux then illuminates the reticle 26 to form pattern light. The thus-formed pattern light is reduced to ¼ in size by the projection optical system 27 and is projected from the projection optical system 27 onto the resist film of the silicon wafer W.

A process of exposure by the pattern light projection is serially performed including a positioning action through the stage 21 and a step/repeat exposure action. Incidentally, the arrangement for using the reflection-type aspherical lens 50 (i.e., an aspherical mirror) for the reflecting mirror 23 serves to effectively lessen a load imposed on the illumination optical system 24.

The above-described method for manufacture of an optical element permits the manufacture of the optical element with a high degree of precision and high productivity. The optical element can be manufactured with such a material that has been hardly machinable by the conventional method. Therefore, the invention is applicable to such a wavelength region that has been hardly suitable.

Figure 26:
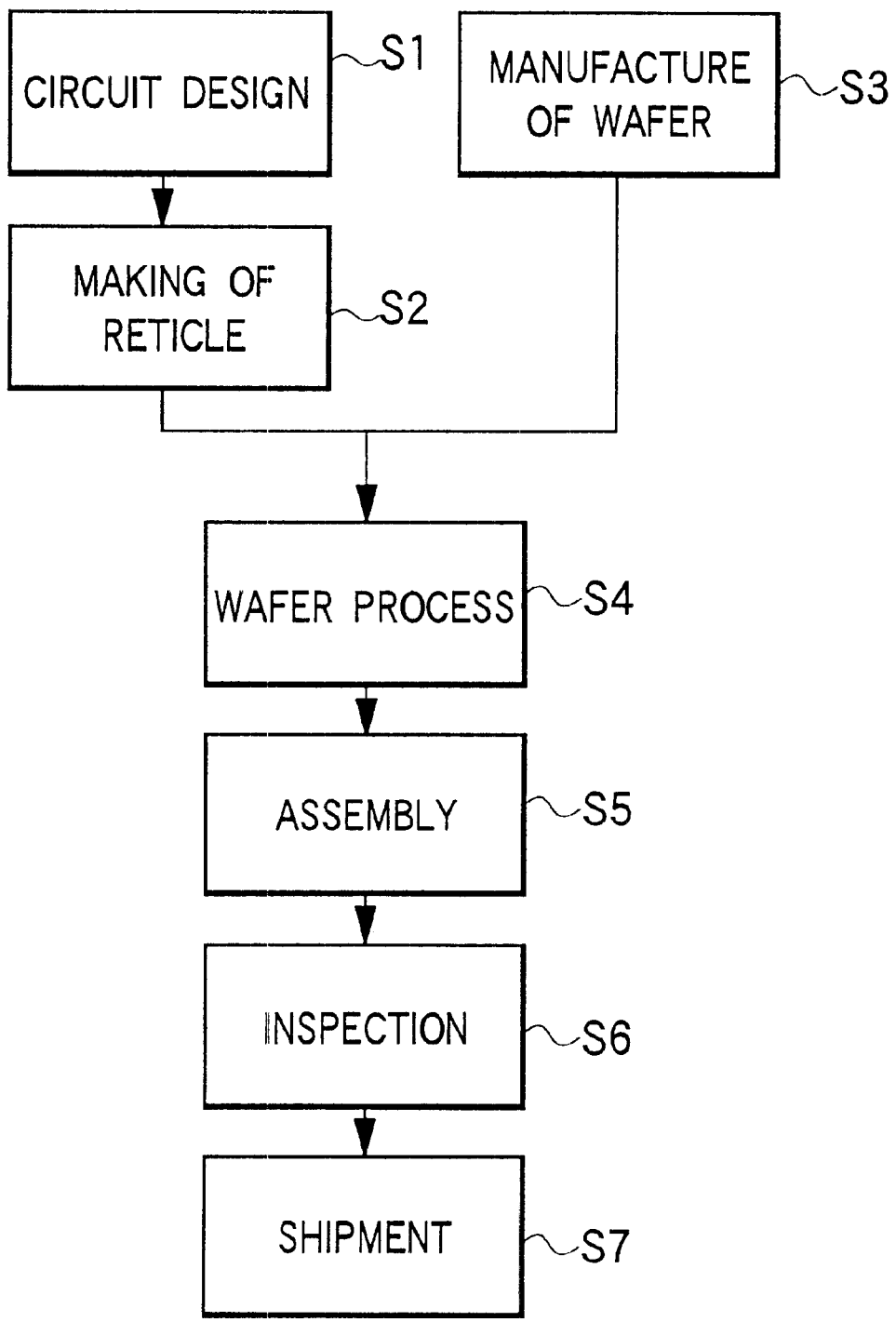
FIG. 26 is a flow chart showing processes of manufacturing a semiconductor device.

FIG. 26 is a flow chart showing processes of manufacturing a semiconductor chip of IC or LSI or a device such as a liquid crystal panel, a CCD, a magnetic head or the like, i.e., a method for manufacturing a semiconductor device by using a Kr excimer laser stepper having optical systems incorporating therein the BO lens and aspherical lens of varied kinds manufactured by the above-described methods. Referring to FIG. 26, the circuit of a semiconductor device is designed at a step S1. At a step S2, a reticle is made by writing the pattern of the designed circuit on a chromium mask with an EB (electron beam) lithography apparatus.

Meanwhile, a wafer is manufactured, at a step S3, by using a material such as silicon. At a step S4, a wafer process called the pre-process is performed to form an actual circuit on the wafer by lithography using the reticle and the wafer. At a step S5, a so-called post-process is performed to further process the wafer processed at the step S4 into a semiconductor chip. The step S5 includes an assembly process for performing dicing and bonding and a packaging process for enclosing and sealing the chip. At a step S6, an inspection process is performed by testing the semiconductor device manufactured at the step S5 for its operation, durability, etc., to complete the semiconductor manufacturing processes. At a step S7, the semiconductor device is shipped.

FIG. 27 is a flow chart showing the details of the wafer process at the step S4 in FIG. 26. At a step S11 of FIG. 27, the surface of the wafer is oxidized. At a step S12, an insulation film is formed on the surface of the wafer by a CVD method. At a step S13, electrodes are formed on the wafer by vapor deposition. At a step S14, ion is implanted into the wafer. At a step S15, a chemically amplified resist is applied to the surface of the wafer. At a step S16, the resist film on the wafer is exposed to the circuit pattern of the reticle by the step/repeat exposure of the KrF excimer laser stepper. At a step S17, the exposed resist on the wafer is subjected to a developing process. This developing process includes a PEB (post-exposure bake) process which is applicable to the chemically amplified resist. At a step S18, all parts other than the developed resist image are stripped by etching. At a step S19, the parts of the resist which have become unnecessary after completion of the etching process are removed. By repeating the above steps, a multiple circuit pattern is formed on the wafer. Thus, a highly integrated device can be manufactured at a high rate of productivity by the above manufacturing method.

What is claimed is:

1. A method for manufacture of an optical element comprising:
    a) forming a thin film on a mold coated with a tungsten-molybdenum alloy film;
    b) bonding a substrate to said thin film by a direct bonding process; and
    c) separating said thin film and said substrate from said mold.

2. A method according to claim 1, wherein said thin film is a reflecting film.

3. A method according to claim 1, wherein said thin film is a multilayer film.

4. A method according to claim 3, wherein said multilayer film includes an antireflection film.

5. A method according to claim 1, wherein said optical element is a diffractive optical element.

6. A method according to claim 5, wherein said diffractive optical element is a binary optics element, an aspherical lens, or a spherical lens.

7. A method according to claim 1, wherein said thin film is formed by one of a CVD method, a vacuum vapor deposition method, a sputtering vapor deposition method, or an iron beam sputtering method.

8. A method according to claim 1, wherein said thin film is formed by an oxidized film forming method which comprises hydrolyzing a coating film of an organic metal compound selected from the group consisting of organic silicon, organic aluminum and organic titanium.

9. A method according to claim 1, wherein said thin film is made of a material selected from the group consisting of quartz, fluorite, metal oxide and fluoride.

10. A method according to claim 1, wherein said substrate is made of a material selected from the group consisting of quartz, fluorite, metal oxide and fluoride.

11. A method for manufacture of an optical element comprising:
    a) forming a thin film on a mold coated with a tungsten-molybdenum film;
    b) polishing a surface of said thin film;
    c) bonding a substrate to said thin film by a direct bonding process; and
    d) separating said thin film and said substrate from said mold.

12. A method according to claim 11, wherein said thin film is a reflecting film.

13. A method according to claim 11, wherein said thin film is a multilayer film.

14. A method according to claim 13, wherein said multilayer film included a reflecting film or an antireflection film.

15. An optical element according to claim 11, wherein said optical element is a diffractive optical element.

16. A method according to claim 15, wherein said diffractive optical element is a binary optics element, an aspherical lens, or a spherical lens.

17. A method according to claim 11, wherein said thin film is formed by one of a CVD method, a vacuum vapor deposition method, a sputtering vapor deposition method, or an ion beam sputtering method.

18. A method according to claim 11, wherein said thin film is formed by an oxidized film forming method which comprises hydrolyzing a coating film of an organic metal compound selected from the group consisting of organic silicon, organic aluminum and organic titanium.

19. A method according to claim 11, wherein said thin film is made of a material selected from the group consisting of quartz, fluorite, metal oxide and fluoride.

20. A method according to claim 11, wherein said substrate is made of a material selected from the group consisting of quartz, fluorite, metal oxide and fluoride.

21. A method according to claim 1, wherein said thin film and said substrate is separated from said mold using a method selected from the group consisting of (1) energizing said mold to heat said mold, said thin film and said substrate, (2) dipping said mold, said film and said substrate in an aqueous solution in which a surface active agent is added, and (3) putting an ultrasonic wave on said mold, said film and said substrate in said aqueous solution.

22. A method according to claim 11, wherein said thin film and said substrate is separated from said mold using a method selected from the group consisting of (1) energizing said mold to heat said mold, said thin film and said substrate, (2) dipping said mold, said film and said substrate in an aqueous solution in which a surface active agent is added, and (3) putting an ultrasonic wave on said mold, said film and said substrate in said aqueous solution.

23. A method according to claim 1, wherein a binary optics lens having a design wavelength of 248 nm is formed.

24. A method according to claim 11, wherein a binary optics lens having a design wavelength of 248 nm is formed.

* * * * *

UNITED STATES PATENT AND TRADEMARK OFFICE
CERTIFICATE OF CORRECTION

PATENT NO. : 6,652,781 B2
DATED : November 25, 2003
INVENTOR(S) : Hideo Kato et al.

It is certified that error appears in the above-identified patent and that said Letters Patent is hereby corrected as shown below:

Column 7,
Line 19, "for" should read -- to be --.

Column 9,
Line 64, "later" should read -- laser --.

Column 12,
Line 8, "included" should read -- includes --.

Signed and Sealed this

Tenth Day of August, 2004

JON W. DUDAS
*Acting Director of the United States Patent and Trademark Office*